US010011046B2

(12) United States Patent
Kato

(10) Patent No.: US 10,011,046 B2
(45) Date of Patent: Jul. 3, 2018

(54) FIXED-ABRASIVE-GRAIN WIRE, WIRE SAW, AND METHOD FOR SLICING WORKPIECE

(71) Applicant: SHIN-ETSU HANDOTAI CO., LTD., Tokyo (JP)

(72) Inventor: Tadahiro Kato, Annaka (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 92 days.

(21) Appl. No.: 15/311,325

(22) PCT Filed: Mar. 18, 2015

(86) PCT No.: PCT/JP2015/001501
§ 371 (c)(1),
(2) Date: Nov. 15, 2016

(87) PCT Pub. No.: WO2015/182023
PCT Pub. Date: Dec. 3, 2015

(65) Prior Publication Data
US 2017/0072594 A1 Mar. 16, 2017

(30) Foreign Application Priority Data
May 28, 2014 (JP) .................. 2014-110503

(51) Int. Cl.
*B28D 5/04* (2006.01)
*B24B 27/06* (2006.01)
(Continued)

(52) U.S. Cl.
CPC ........... *B28D 5/045* (2013.01); *B23D 61/185* (2013.01); *B24B 27/06* (2013.01);
(Continued)

(58) Field of Classification Search
CPC ............. B28D 5/04; B28D 5/00; B28D 27/06
(Continued)

(56) References Cited

U.S. PATENT DOCUMENTS

2005/0155595 A1 7/2005 Kondo et al.
2008/0226081 A1 9/2008 Terao
(Continued)

FOREIGN PATENT DOCUMENTS

CN 102756176 A 10/2012
CN 103643273 A 3/2014
(Continued)

OTHER PUBLICATIONS

Aug. 25, 2017 Search Report issued in Taiwanese Patent Application No. 104109092.
(Continued)

*Primary Examiner* — Robert Rose
(74) *Attorney, Agent, or Firm* — Oliff PLC

(57) ABSTRACT

The present invention is a fixed-abrasive-grain wire including a core wire and abrasive grains fixed on a surface of the core wire, wherein an abrasive grain density is 1200 grains/$mm^2$ or more, where the abrasive grain density is the number of the abrasive grains per unit area on the surface of the core wire, and 2% or less of all distances between centroids of the abrasive grains are equal to or shorter than an average circle equivalent diameter of the whole abrasive grains. There can be provided a fixed-abrasive-grain wire, a wire saw, and a method for slicing a workpiece that can suppress meandering of the fixed-abrasive-grain wire during slicing a workpiece and improve TTV and warp of wafers sliced from the workpiece.

16 Claims, 4 Drawing Sheets

(51) Int. Cl.
  *B24D 3/00* (2006.01)
  *B24D 11/00* (2006.01)
  *H01L 21/304* (2006.01)
  *B28D 5/00* (2006.01)
  *B23D 61/18* (2006.01)

(52) U.S. Cl.
  CPC ............ *B24B 27/0633* (2013.01); *B24D 3/00* (2013.01); *B24D 3/004* (2013.01); *B24D 11/00* (2013.01); *B28D 5/0076* (2013.01); *H01L 21/304* (2013.01)

(58) Field of Classification Search
  USPC .................................. 125/21, 16.02; 451/168
  See application file for complete search history.

(56) References Cited

U.S. PATENT DOCUMENTS

| | | | |
|---|---|---|---|
| 2014/0017984 A1 | 1/2014 | Rehrig et al. | |
| 2015/0040884 A1* | 2/2015 | Ueda | B24B 27/0633 125/21 |
| 2015/0283666 A1* | 10/2015 | Nakajima | B24B 27/0633 125/21 |

FOREIGN PATENT DOCUMENTS

| | | |
|---|---|---|
| CN | 203600446 U | 5/2014 |
| JP | 2003-004646 A | 1/2003 |
| JP | 2003-326449 A | 11/2003 |
| JP | 2005-074599 A | 3/2005 |
| JP | 2006-095644 A | 4/2006 |
| JP | 2008-236091 A | 10/2008 |
| JP | 2010-074056 A | 4/2010 |
| JP | 2011-079106 A | 4/2011 |
| JP | 2013-043268 A | 3/2013 |
| JP | 2013-144352 A | 7/2013 |

OTHER PUBLICATIONS

Dec. 28, 2017 Chinese Office Action and Search Report issued in Application No. 201580025826.6.

Jun. 16, 2015 International Search Report issued in International Patent Application No. PCT/JP2015/001501.

* cited by examiner

FIXED-ABRASIVE-GRAIN WIRE, WIRE SAW, AND METHOD FOR SLICING WORKPIECE

TECHNICAL FIELD

The present invention relates to a fixed-abrasive-grain wire, a wire saw, and a method for slicing a workpiece.

BACKGROUND ART

A workpiece such as a 300-mm diameter silicon ingot is mainly sliced in a conventional loose-abrasive-grain manner, in which the workpiece is sliced while supplying slurry containing suspended abrasive grains composed of, for example, silicon carbide to a wire. This manner takes 20 to 25 hours for slicing when using silicon carbide abrasive grains with a grit size of #1000 to #1500 (average abrasive grain diameter: about 8 to 10 μm).

It has been recently said that high integration of semiconductor devices such as DRAM, NAND flash memory, and MPU approaches technical limits, and cost reduction per silicon semiconductor device by miniaturization accordingly reaches its limit. In view of this; diameter enlargement to 450 mm is considered to yield more semiconductor devices from one wafer and continuously reduce the cost.

When the 450-mm diameter silicon ingot is sliced in the loose-abrasive-grain manner with abrasive grains such as silicon carbide grains, it essentially takes 40 to 50 hours for slicing along with the increase in area of the silicon ingot. This significantly reduces productivity per wafer.

Then, slicing the 450-mm diameter silicon ingot uses a fixed-abrasive-grain wire having diamond abrasive grains fixed to a core wire, which is employed to slice ingots for solar cells such as silicon, glass, magnet, crystal, sapphire, and silicon carbide (SiC) ingots (see Patent Document 1) A typical fixed-abrasive-grain wire is produced by fixing diamond abrasive grains with a minimum diameter of 4 μm and a maximum diameter of 16 μm on the surface of a metal core wire with a diameter of about 0.1 mm by electrolytic plating.

Slicing an ingot with the fixed-abrasive-grain wire uses a usual multi-wire saw to slice the ingot by pressing the ingot against the wire while supplying a coolant containing no abrasive grain to the travelling fixed-abrasive-grain wire. Compared with the conventional loose-abrasive-grain slicing manner, in which the ingot is sliced while supplying slurry containing suspended abrasive grains composed of, for example, silicon carbide with an average abrasive grain diameter of about 10 μm to the wire, the above manner can shorten the slicing time to half to one-third. Also, disuse of loose abrasive grains provides great advantages of the reduction in costs required for separating abrasive grains and metal powder or disposing a waste liquid used in slicing.

CITATION LIST

Patent Literature

Patent Document 1: Japanese Unexamined Patent publication (Kokai) No. 2010-74056

SUMMARY OF INVENTION

Technical Problem

In general, stricter flatness and warp are required on semiconductor silicon wafers with miniaturization of large scale integrated circuits (LSI), specifically memory LSI and logic LSI. The warp is a parameter indicative of the shape when a silicon wafer is kept in a natural state without any vacuum suction. As shown in FIG. 5, a thickness central plane is used as a measurement plane, a best fit plane of the thickness central plane is used as a reference plane, and the warp is defined as a difference between minimum and maximum values, each obtained by subtracting the reference plane from the measurement plane. A wafer with a degraded warp can cause focus deviation and overlay failure in a device exposure process. In particular, a large diameter wafer having a diameter of 450 mm considerably causes these problems.

What is matters in slicing a silicon ingot with the fixed-abrasive-grain wire is an accuracy of wafer shape after slicing. TTV (a difference between maximum and minimum values of wafer in-plane thickness) and warp of sliced-out wafers are compared between the following two cases: a silicon ingot having a diameter of 450 mm and a length of about 120 mm is sliced with the fixed-abrasive-grain wire, in which diamond abrasive grains with a minimum diameter of 4 μm and a maximum diameter of 16 μm are fixed to a 0.1-mm diameter core wire, over 23 hours; the silicon ingot is sliced with the conventional loose abrasive grains while supplying slurry containing suspended silicon carbide abrasive grains with an average abrasive grain diameter of about 10 μm to the wire over 48 hours.

As shown in FIG. 6, both TTV and warp of the wafers sliced out with the conventional and typical fixed-abrasive-grain wire are significantly worse than TTV and warp of the wafers sliced out in the loose-abrasive-grain manner. Moreover, it is known that slicing with the fixed-abrasive-grain wire cannot significantly improve TTV and warp even when the slicing time is prolonged, and the fixed-abrasive-grain wire tends to meander through the workpiece during slicing.

The present invention was accomplished in view of the above-described problems. It is an object of the present invention to provide a fixed-abrasive-grain wire, a wire saw, and a method for slicing a workpiece that can control meandering of the fixed-abrasive-grain wire during slicing a workpiece and improve TTV and warp of wafers sliced from the workpiece.

Solution to Problem

To achieve the object, the present invention provides a fixed-abrasive-grain wire comprising a core wire and abrasive grains fixed on a surface of the core wire, wherein an abrasive grain density is 1200 grains/mm$^2$ or more, where the abrasive grain density is the number of the abrasive grains per unit area on the surface of the core wire, and 2% or less of all distances between centroids of the abrasive grains are equal to or shorter than an average circle equivalent diameter of the whole abrasive grains.

The above abrasive grain density enables the control of meandering of the fixed-abrasive-grain wire during slicing the workpiece, which is caused by a low abrasive grain density. On the other hand, a high abrasive grain density easily causes agglomeration of the abrasive grains and thus causes meandering of the fixed-abrasive-grain wire during slicing the workpiece. In the present invention, however, the percentage of the intercentroid distance equal to or shorter than the average circle equivalent diameter is 2% or less. This percentage allows the fixed abrasive grains to be uniformly distributed, reducing agglomeration of the abrasive grains. The meandering of the fixed-abrasive-grain wire due to the agglomeration of the abrasive grains can be thus controlled. Consequently, the inventive fixed-abrasive-grain wire can improve properties such as TTV and warp of wafers sliced from the workpiece, enabling wafers with good shape accuracy to be obtained at high productivity.

The abrasive grains may be diamond abrasive grains.

The diamond abrasive grains are preferably used as the abrasive grains of the inventive fixed-abrasive-grain wire.

In the fixed-abrasive-grain wire, the abrasive grains fixed on the surface of the core wire may have a particle size distribution in which a minimum grain diameter is 4 μm and a maximum grain diameter is 16 μm.

The abrasive grains of the inventive fixed-abrasive-grain wire preferably have the above particle size distribution. Such abrasive grains enable the workpiece to be efficiently sliced.

Furthermore, to achieve the object, the present invention provides a wire saw comprising a wire row formed by spirally winding the inventive fixed-abrasive-grain wire around a plurality of wire guides, a workpiece-feeding unit for holding a workpiece and pressing the workpiece against the wire row, and a nozzle for supplying a coolant to a contact portion between the workpiece and the wire, wherein the wire saw is configured to slice the workpiece into wafers by pressing the workpiece against the wire row with the workpiece-feeding unit while supplying the coolant to the wire through the nozzle.

Such a wire saw can control meandering of the fixed-abrasive-grain wire during slicing the workpiece and improve TTV and warp of wafers sliced from the workpiece, thus enabling wafers with good shape accuracy to be obtained at higher productivity than in the loose-abrasive-grain manner.

Furthermore, to achieve the object, the present invention provides a method for slicing a workpiece, comprising: preparing a fixed-abrasive-grain wire having a core wire and abrasive grains fixed on a surface of the core wire; forming a wire row by spirally winding the prepared fixed-abrasive-grain wire around a plurality of wire guides; and pressing the workpiece against the wire row while imparting axial reciprocating motion to the fixed-abrasive-grain wire to slice the workpiece into wafers, wherein preparing the fixed-abrasive-grain wire includes the steps of taking an image of a surface of the fixed-abrasive-grain wire and extracting the abrasive grains on the image by an image binarization analysis, measuring the number of the extracted abrasive grains and determining an abrasive grain density that is the number of the abrasive grains per unit area, measuring circle equivalent diameters of the extracted abrasive grains and calculating an average circle equivalent diameter of the whole abrasive grains, measuring centroids of the extracted abrasive grains and determining all distances between the centroids of the abrasive grains, and selecting the fixed-abrasive-grain wire if the fixed-abrasive-grain wire satisfies that the determined abrasive grain density is 1200 grains/mm$^2$ or more, and 2% or less of the determined distances between the centroids of the abrasive grains are equal to or shorter than the calculated average circle equivalent diameter of the whole abrasive grains, whereby the workpiece is sliced with the selected fixed-abrasive-grain wire.

Such a method enables easy and precise selection of the fixed-abrasive-grain wire satisfying that the abrasive grain density is 1200 grains/mm$^2$ or more, and 2% or less of all the distances between the centroids of the abrasive grains are equal to or shorter than the average circle equivalent diameter of the whole abrasive grains, so the selected wire can be used to slice the workpiece. In this manner, wafers with high shape accuracy can be sliced from the workpiece at higher productivity than in the loose-abrasive-grain manner. Furthermore, the cost of disposing a waste liquid of slurry can be more reduced than in the loose-abrasive-grain manner.

The image of the surface of the fixed-abrasive-grain wire can be taken with a scanning electron microscope or a confocal laser microscope.

In the present invention, such devices are preferably used to observe the surface of the fixed-abrasive-grain wire.

The abrasive grains may be diamond abrasive grains.

The diamond abrasive grains are preferably used as the abrasive grains of the fixed-abrasive-grain wire.

The abrasive grains fixed on the surface of the core wire in the prepared fixed-abrasive-grain wire may have a particle size distribution in which a minimum grain diameter is 4 μm and a maximum grain diameter is 16 μm.

In the present invention, the abrasive grains having such fine particle size distribution are preferably used. Such abrasive grains enable the workpiece to be efficiently sliced.

Advantageous Effects of Invention

The inventive fixed-abrasive-grain wire, wire saw, and method for slicing a workpiece can significantly shorten the slicing time compared with slicing in the loose-abrasive-grain manner, and significantly improve the shape accuracy such as TTV and warp of the wafers compared with slicing in the conventional fixed-abrasive-grain manner. Thus, the invention, which enables a silicon ingot to be sliced with the fixed-abrasive-grain wire at high productivity, can be applied to the large diameter silicon wafers for memory LSI or logic LSI, which require strict wafer shape accuracy. Furthermore, disuse of loose abrasive grains enables great cost reduction in a wafer manufacturing process.

DESCRIPTION OF EMBODIMENTS

Figure 1:
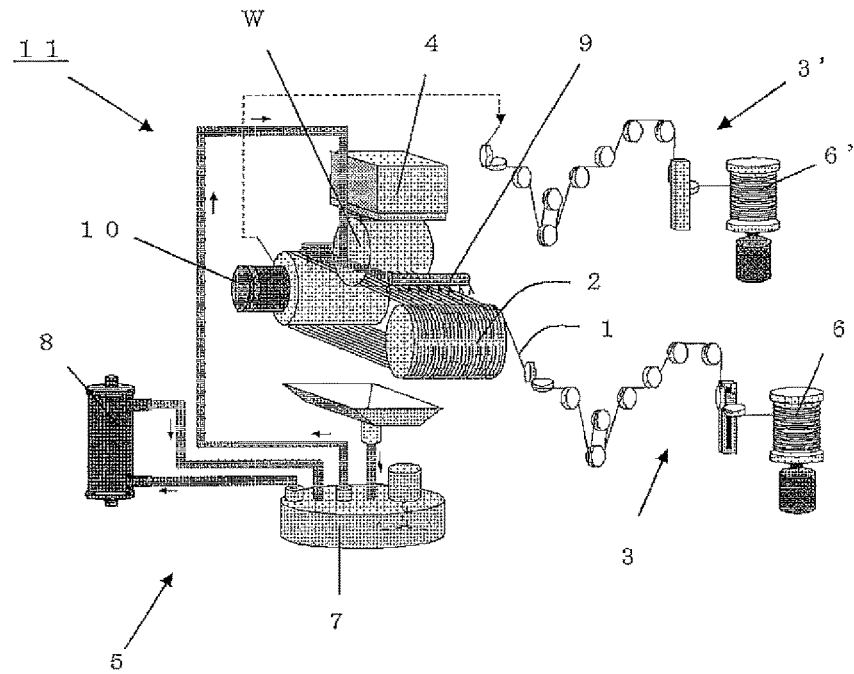
FIG. 1 is a schematic diagram showing an example of the inventive wire saw.

Hereinafter, embodiments of the present invention will be described, but the present invention is not limited thereto.

As mentioned above, the method for slicing a workpiece with the fixed-abrasive-grain wire can slice the workpiece in a short time, but degrades the shape accuracy of sliced-out wafers, compared with the method for slicing a workpiece with the loose-abrasive-grain wire.

To solve the problems, the present inventor repeatedly and keenly conducted studies as follows.

The degradation in wafer shape accuracy due to use of the fixed-abrasive-grain wire is considered to be caused by meandering of the fixed-abrasive-grain wire itself during slicing. The present inventor assumed that the wire meandering is caused by variation in abrasive grain density on the surface of the fixed-abrasive-grain wire and repeatedly conducted experiments.

As a result, the following is revealed: The shape accuracy such as TTV and warp tends to improve with an increase in abrasive grain density, which is the number of abrasive grains per unit area, but these TTV and warp are worse than those in the loose-abrasive-grain slicing manner. In contrast, the fixed-abrasive-grain wire having more than a prescribed abrasive grain density significantly degrades the shape accuracy such as TTV and warp. That is, wafers with good shape accuracy cannot be obtained only by increasing the abrasive grain number.

The inventor then investigated the cause of degradation in wafer shape by the fixed-abrasive-grain wire having more than a prescribed abrasive grain density, and confirmed that the wafer shape accuracy is changed by a dispersion state (an agglomeration state) of the abrasive grains on the surface of the fixed-abrasive-grain wire, and good shape accuracy can be achieved when the abrasive grains are uniformly dispersed in a prescribed level.

From these findings, the inventor found that degradation of the wafer shape accuracy can be controlled by increasing the density of abrasive grains on the surface of the core wire, i.e., increasing the number of the abrasive grains and uniformly dispersing the increased abrasive grains. The inventor then found that the above problems can be solved by a fixed-abrasive-grain wire satisfying that the abrasive grain density is 1200 grains/mm$^2$ or more, and the percentage of the distance between centroids of the abrasive grains that is equal to or shorter than the average circle equivalent diameter of the whole abrasive grains is 2% or less out of all distances between centroids of the abrasive grains, thereby bringing the present invention to completion.

In the following, the present invention will be described in more detail.

First, the inventive fixed-abrasive-grain wire will be described in detail.

The fixed-abrasive-grain wire has a core wire and abrasive grains fixed on the surface of the core wire.

The core wire may be made of metal. Its diameter may be, for example, about 0.1 mm.

The abrasive grains fixed on the surface of the core wire of the inventive fixed-abrasive-grain wire may have a particle size distribution in which a minimum grain diameter is 4 μm and a maximum grain diameter is 16 μm.

When the fixed-abrasive-grain wire has the abrasive grains with such fine particle size distribution, the shape quality such as TTV and warp of the wafers can be more improved.

The abrasive grains fixed on the core wire may be diamond abrasive grains.

The diamond abrasive grains are particularly preferable as the abrasive grains of the inventive fixed-abrasive-grain wire.

The inventive fixed-abrasive-grain wire is characterized in that the abrasive grain density, which is the number of the abrasive grains per unit area on the surface of the core wire, is 1200 grains/mm$^2$ or more, and the percentage of the intercentroid distances equal to or shorter than the average circle equivalent diameter of the whole abrasive grains is 2% or less in distribution of all intercentroid distances of the abrasive grains.

Basically, the more the abrasive grains are fixed on the surface, the more degradation of the wafer shape accuracy can be controlled. When the number of the abrasive grains per unit area is 1200 grains/mm$^2$ or more like the present invention, degradation of the wafer shape accuracy due to lack of the abrasive grains can be controlled, and the workpiece can be sliced into wafers with better shape. The density may be 1500 grains/mm$^2$ or more.

If the number of the abrasive grains is increased and the abrasive grains are gathered at a certain portion on the surface of the core wire (i.e., if the abrasive grains are agglomerated), the fixed-abrasive-grain wire meanders during slicing the workpiece, and the wafer shape accuracy is degraded. This agglomeration state of the abrasive grains can be detected as overlapping of the abrasive grains. It can be judged that, out of all distances between centroids of the abrasive grains, the higher the percentage of the distance equal to or shorter than the average circle equivalent diameter of the abrasive grains, the more the abrasive grains are agglomerated.

Therefore, when the percentage of the intercentroid distance equal to or shorter than the average circle equivalent diameter is 2% or less out of all intercentroid distances of the abrasive grains like the present invention, non-uniformity of the distribution of the abrasive grains is extremely inhibited, and the abrasive grains are uniformly dispersed without agglomeration. The degradation of the wafer shape accuracy caused by the agglomeration is thus reduced.

An exemplary method for producing the inventive fixed-abrasive-grain wire will be now described.

The inventive fixed-abrasive-grain wire can be produced by fixing abrasive grains such as diamond abrasive grains to the surface of a metal core wire by electrolytic nickel plating. The metal core wire may be, for example, a piano wire.

Figure 8:
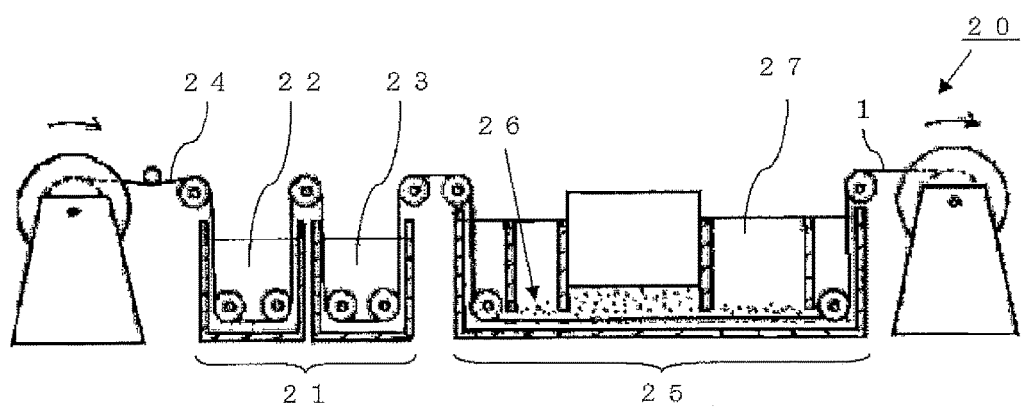
FIG. 8 is a schematic diagram showing an example of a producing apparatus usable for producing the inventive fixed-abrasive-grain wire.

Specifically, the fixed-abrasive-grain wire can be produced with a producing apparatus as shown in FIG. 8.

In the apparatus 20 for producing a fixed-abrasive-grain wire shown in FIG. 8, first, stain and rust on the surface of a core wire 24 are removed in a pretreatment tank 21 with an acetone solution 22 and a hydrochloric acid solution 23. The core wire 24 is then caused to pass through a plating solution 27 containing dispersed abrasive grains 26 such as diamond abrasive grains in plating tank 25 so that the diamond abrasive grains are bonded to the surface of the core wire 24 by electrodeposition together with nickel ions eluted from a nickel electrode positively charged. The fixed-abrasive-grain wire 1 can be thereby produced. The embodiment described above is a typical producing method and a producing apparatus used in the method, but the method for producing the inventive fixed-abrasive-grain wire is not limited thereto, and the inventive fixed-abrasive-grain wire can be produced by any other producing method.

The inventive wire saw will be now described with reference to FIG. 1.

As shown in FIG. 1, a fixed-abrasive-grain type of wire saw 11 mainly includes a fixed-abrasive-grain wire 1 for slicing a workpiece W, grooved rollers 2, tensile-force-applying mechanisms 3, 3', a workpiece-feeding unit 4, and a coolant-supplying unit 5. The fixed-abrasive-grain wire 1 is the inventive fixed-abrasive-grain wire described above.

The fixed-abrasive-grain wire 1 is reeled out from one wire reel 6 and enters the grooved rollers 2 through a traverser after passing through the tensile-force-applying mechanism 3 that includes a powder clutch (a constant torque motor) and a dancer roller (a deadweight). The grooved rollers 2 may be rollers formed by press-fitting polyurethane resin around a steel cylinder and then cutting grooves on its surface at regular intervals.

The fixed-abrasive-grain wire 1 is wound around the grooved rollers 2 about 300 to 400 times to form a wire row. The fixed-abrasive-grain wire 1 is rolled up around the other wire reel 6' after passing through the other tensile-force-applying mechanism 3'. With a drive motor 10, reciprocating motion can be imparted to the wound fixed-abrasive-grain wire 1. In the reciprocating motion of the fixed-abrasive-grain wire 1, the fixed-abrasive-grain wire 1 may travel different distances in each direction; thus the travel distance in one direction may be larger than in the other direction such that a new line of the wire is supplied. This allows the new line to be supplied in a direction of the longer distance while the reciprocating motion of the fixed-abrasive-grain wire 1 continues.

The coolant-supplying unit 5 includes a tank 7, a chiller 8, and a nozzle 9. The nozzle 9 is disposed above the wire row formed by winding the fixed-abrasive-grain wire 1 around the grooved rollers 2. The nozzle 9 is connected to the tank 7, and the coolant whose temperature is controlled by the chiller 8 is supplied to the fixed-abrasive-grain wire 1 through the nozzle 9.

The workpiece W is held by the workpiece-feeding unit 4. The workpiece-feeding unit 4 is configured to move the workpiece W downward from above the wire to below the wire to press the workpiece W against the reciprocating fixed-abrasive-grain wire 1 and slice the workpiece. At this time, the held workpiece W can be fed at a preprogrammed feed speed by a predetermined feed amount with computer control. After the workpiece W is sliced, the workpiece W can be moved in a direction opposite to the feed direction to pull the sliced workpiece W out of the wire row.

Such a wire saw including the inventive fixed-abrasive-grain wire can significantly shorten the slicing time compared with a loose-abrasive-grain type of wire saw, and can slice a workpiece with better shape accuracy than does a conventional fixed-abrasive-grain type of wire saw.

The inventive method for slicing a workpiece will be now described.

Figure 2:
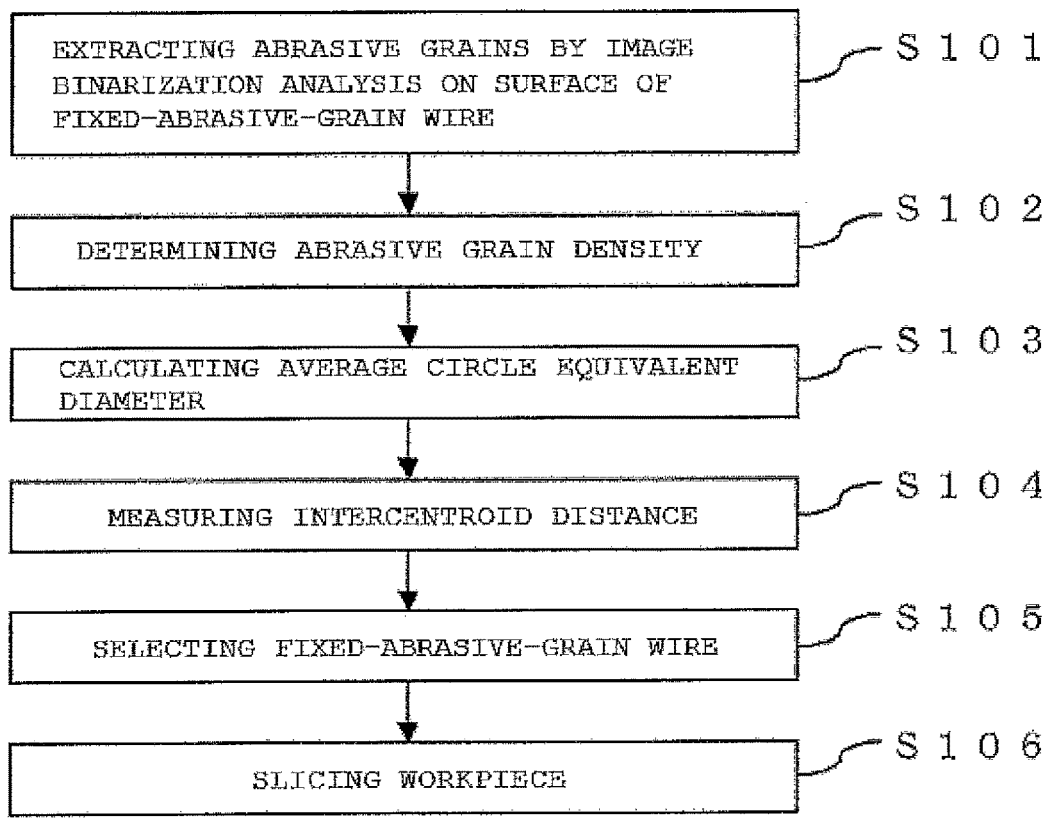
FIG. 2 is a flow chart showing an example of the inventive method for slicing a workpiece.

The inventive method for slicing a workpiece includes steps described below as shown in FIG. 2.

First, a fixed-abrasive-grain wire is prepared. At this time, an image of the surface of the fixed-abrasive-grain wire is taken, and the abrasive grains on the image are extracted by an image binarization analysis (S101 in FIG. 2).

The image of the surface of the fixed-abrasive-grain wire may be taken with a scanning electron microscope or a confocal laser microscope.

In particular, a scanning electron microscope or a confocal laser microscope having a depth of focus nearly equal to the radius of the fixed-abrasive-grain wire is preferably used to take the image of the surface of the fixed-abrasive-grain wire.

Figure 7:
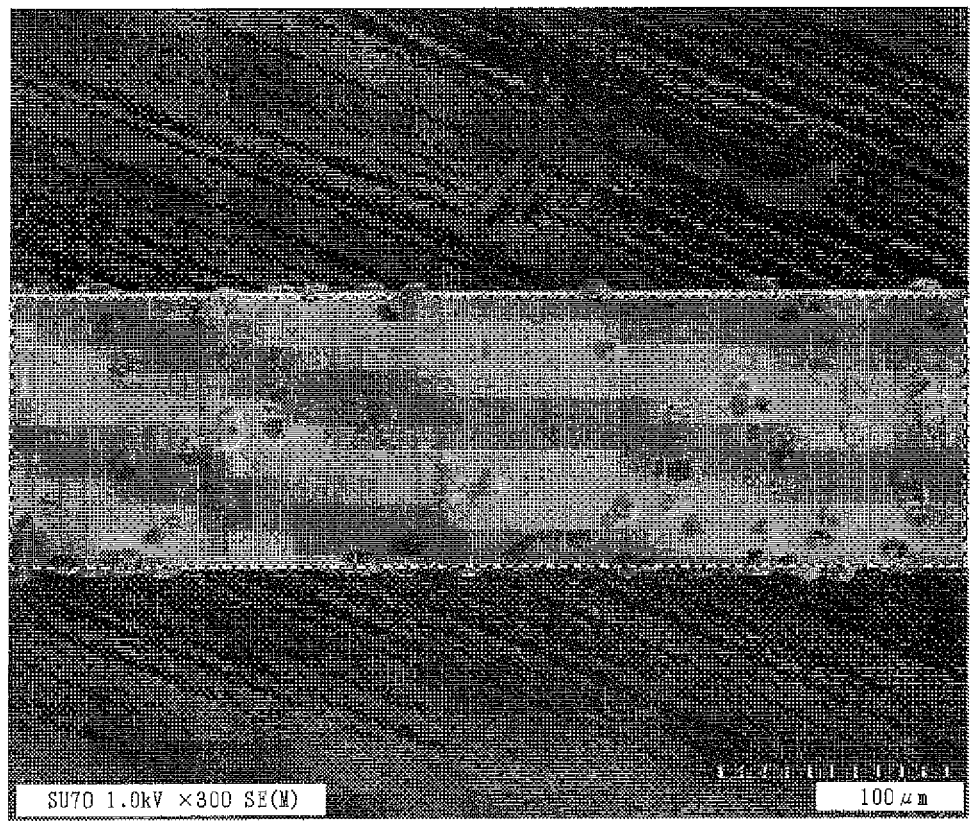
FIG. 7 is an image showing an example of image binarization analysis by image processing software.

The taken image may be analyzed by image binarization with, for example, image processing software WinRoof (available from MITANI Corp.) as shown in FIG. 7.

Then, the number of the abrasive grains extracted by the image binarization analysis is measured, and the abrasive grain density, which is the number of the abrasive grains per unit area, is determined (S102 in FIG. 2).

Then, circle equivalent diameters of the extracted abrasive grains are measured, and an average circle equivalent diameter of the whole abrasive grains is calculated (S103 in FIG. 2).

Then, centroids of the extracted abrasive grains are measured, and all distances between the centroids of the abrasive grains are determined (S104 in FIG. 2).

In this manner, the abrasive grain density, which serves as an index of the number of the abrasive grains on the surface of the fixed-abrasive-grain wire and the dispersion state of the abrasive grains, the average circle equivalent diameter, and distances between the centroids of the abrasive grains are determined.

The order of the step of determining the abrasive grain density based on the extracted abrasive grains (S102 in FIG. 2), the step of calculating the average circle equivalent diameter (S103 in FIG. 2), and the step of measuring the intercentroid distances (S104 in FIG. 2) is not limited to the order shown in the flow chart of FIG. 2; these three steps may be performed in any order.

The taken image of the surface of the fixed-abrasive-grain wire is a planar image, while the surface of the actual wire has a cylindrical shape. Thus, if one wishes to strictly measure the area used as the denominator of the abrasive grain density, the planar image may be converted to the cylindrical shape before measurement. Likewise, the planar image may be previously converted to the cylindrical shape to measure all the distances between centroids of the abrasive grains. In contrast, if one wishes to calculate these indexes as easily as possible, the area used as the denominator of the abrasive grain density and all the distances between centroids of the abrasive grains may be measured with the planar image as it is. Thus, measurement with the conversion to cylindrical shape may be appropriately determined according to a desired measurement accuracy, cost, etc.

Then, the fixed-abrasive-grain wire is selected (S105 in FIG. 2).

In this step, the fixed-abrasive-grain wire is selected if the fixed-abrasive-grain wire satisfies that the abrasive grain density, determined in the step of determining the abrasive grain density (S102 in FIG. 2), is 1200 grains/mm$^2$ or more, and 2% or less of all the distances between the centroids of the abrasive grains, determined in the step of measuring the intercentroid distances (S104 in FIG. 2), are equal to or shorter than the average circle equivalent diameter of the whole abrasive grains, calculated in the step of calculating the average circle equivalent diameter (S103 in FIG. 2).

Then, a wire row is formed by spirally winding the selected fixed-abrasive-grain wire around wire guides, and the workpiece is pressed against the wire row while imparting axial reciprocating motion to the fixed-abrasive-grain wire and supplying a coolant to slice the workpiece into wafers (S106 in FIG. 2). The workpiece is thus completely sliced.

The method like the present invention, which includes taking an image of the surface of the fixed-abrasive-grain wire and measuring the abrasive grain density, intercentroid distances, and average circle equivalent diameter based on the taken image to evaluate the number and the dispersion state (the agglomeration state) of the abrasive grains, can evaluate the state of the abrasive grains on the surface of the fixed-abrasive-grain wire easily and precisely.

As an example of a conventional method for evaluating and inspecting a fixed-abrasive-grain wire, there is proposed a method that includes irradiating a wire with light, taking a projection image of the wire, and detecting the number of abrasive grains, intervals between the abrasive grains, and so on (for example, see Japanese Unexamined Patent publication (Kokai) No. 2006-95644). However, when abrasive grains are detected by projection, an area where the abrasive grains are observed is limited to a small portion. Furthermore, the conventional method, which measures the intervals between the abrasive grains by determining a standard deviation from a contour of the projection image, is hard to distinguish agglomeration of the abrasive grains.

By contrast, the present invention can evaluate the state of the abrasive grains on the surface of the fixed-abrasive-grain wire easily and precisely, as described above.

In this manner, the inventive method allows easy and precise selection of the fixed-abrasive-grain wire satisfying that the number of the abrasive grains fixed is large, i.e., the abrasive grain density is 1200 grains/mm$^2$ or more, and the abrasive grains are uniformly dispersed without a biased distribution, i.e., 2% or less of the distances between centroids of the abrasive grains are equal to or shorter than the average circle equivalent diameter. This allows degradation of the wafer shape accuracy to be controlled. Moreover, slicing in the fixed-abrasive-grain manner enables a significant reduction in the slicing time, an improvement in productivity, and a reduction in cost required for manufacturing wafers.

The abrasive grains are preferably diamond abrasive grains.

The diamond abrasive grains are often used as the abrasive grains in the fixed-abrasive-grain manner.

The abrasive grains fixed on the surface of the core wire in the prepared fixed-abrasive-grain wire may have a particle size distribution in which a minimum grain diameter is 4 μm and a maximum grain diameter is 16 μm.

When the abrasive grains have such a particle size distribution while satisfying the above abrasive grain density and the above percentage of the distance between the centroids of the abrasive grains, wafers with better shape accuracy can be obtained. The particle size distribution can be adjusted to the above range by previously preparing abrasive grains that satisfies the above particle size distribution and fixing the abrasive grains to the core wire.

The inventive method for slicing a workpiece is suited to slice a single crystal silicon ingot especially having a diameter of 450 mm or more.

When such a silicon single crystal ingot having a large diameter is sliced with a fixed-abrasive-grain wire, the slicing method using the conventional fixed-abrasive-grain wire significantly degrades the shape accuracy. However, the inventive method for slicing a workpiece can significantly control degradation of the shape accuracy.

EXAMPLE

Hereinafter, the present invention will be described in more detail with reference to examples and comparative examples, but the present invention is not limited thereto.

Example 1

A fixed-abrasive-grain wire selected in accordance with the inventive method for slicing a workpiece shown in FIG. 2 was attached to a wire saw shown in FIG. 1. A workpiece was sliced with the wire saw in accordance with the inventive method for slicing a workpiece. Then, TTV and warp of all wafers sliced from the workplace were measured and their average values were calculated.

The fixed-abrasive-grain wire used in this example had a core wire with a diameter of 0.1 mm and diamond abrasive grains fixed to the core wire with a particle size distribution in which a minimum diameter was 6 μm and a maximum diameter was 12 μm.

The fixed-abrasive-grain wire had an abrasive grain density of 1200 grains/mm$^2$, and 0.9% of all distances between centroids of the abrasive grains were equal to or shorter than an average circle equivalent diameter of the whole abrasive grains. An image of the surface of the fixed-abrasive-grain wire was taken with a scanning electron microscope. The taken image was analyzed by image binarization with image processing software WinRoof (available from MITANI Corp.).

The workplace to be sliced was a silicon single crystal ingot with a diameter of 450 mm and a length of about 120 mm.

Table 1 summarizes the abrasive grain density (grains/mm$^2$), average circle equivalent diameter (μm), average intercentroid distance (μm), and percentage (%) of the distance equal to or shorter than the average circle equivalent diameter of the whole abrasive grains out of all the distances between the centroids of the abrasive grains in example 1 and examples 2, 3, and comparative examples 1 to 4 described later.

Figure 3:
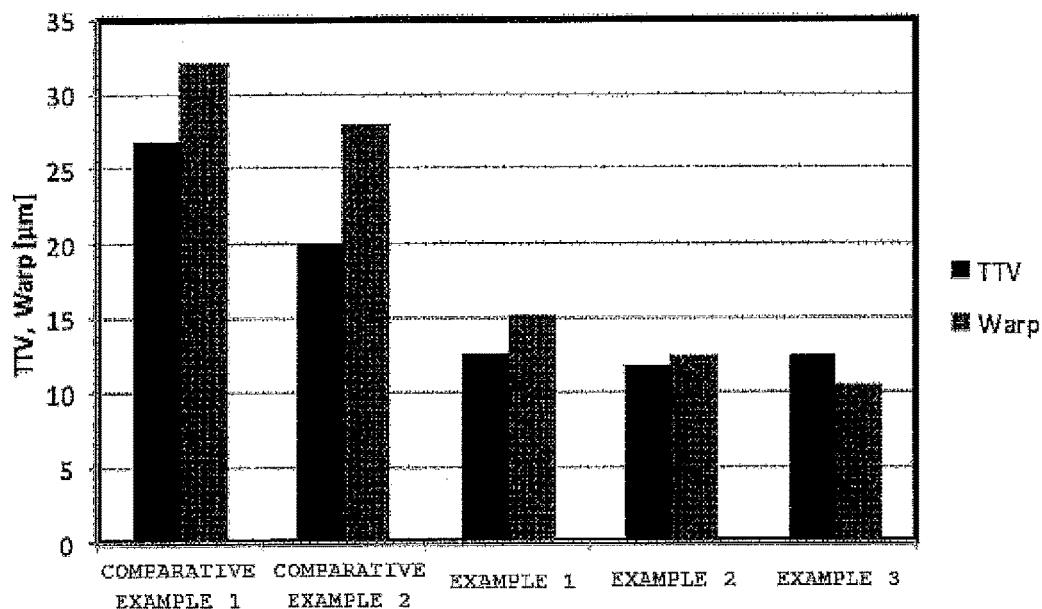
FIG. 3 is a graph showing results of TTV and warp of examples 1 to 3 and comparative examples 1 and 2.

The measurement results of TTV and warp of the sliced-out wafers in examples 1 to 3 and comparative examples 1 to 4 are shown in Table 2 and FIG. 3.

In example 1, the sliced-out wafers had an average TTV of 12.55 (μm) and an average warp of 15.1 (μm); thus the obtained wafers had much better shape accuracy than those in comparative examples described later.

Example 2

A silicon single crystal ingot was sliced under the same condition as in example 1 except that the used fixed-abrasive-grain wire had an abrasive grain density of 1500 grains/mm$^2$, and 2.0% of all distances between centroids of the abrasive grains were equal to or shorter than an average circle equivalent diameter of the whole abrasive grains. Then, average TTV and warp of all sliced-out wafers were calculated.

Consequently, as shown in Table 2 and FIG. 3, the wafers had an average TTV of 11.8 (μm) and an average warp of 12.5 (μm); thus the obtained wafers had much better shape accuracy than those in comparative examples described later.

Example 3

A silicon single crystal ingot was sliced under the same condition as in example 1 except that the used fixed-abrasive-grain wire had an abrasive grain density of 1500 grains/mm$^2$, and 1.5% of all distances between centroids of the abrasive grains were equal to or shorter than an average circle equivalent diameter of the whole abrasive grains. Then, average TTV and warp of all sliced-out wafers were calculated.

Figure 6:
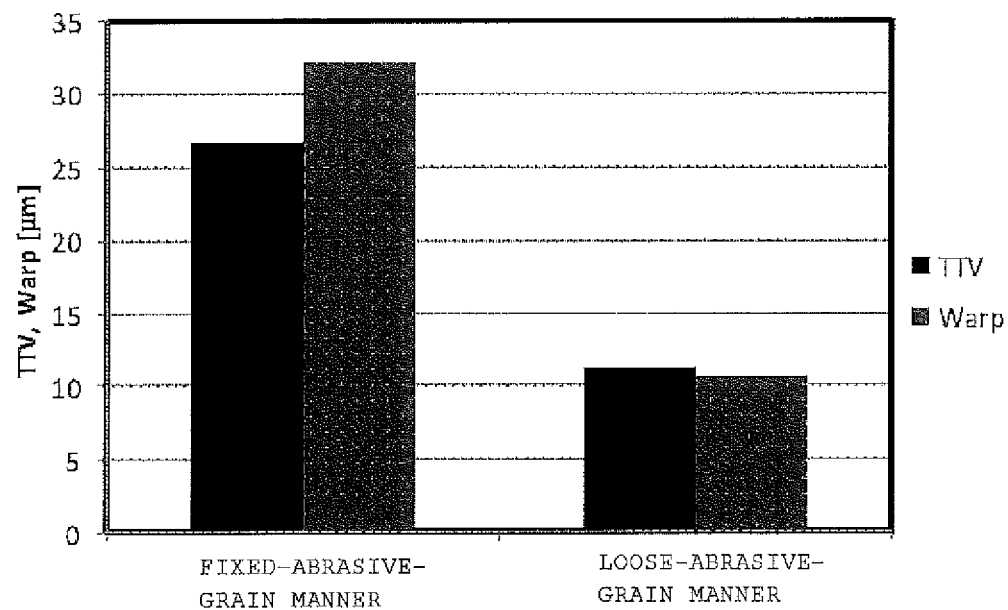
FIG. 6 is a graph showing values of TTV and warp of wafers sliced out in the loose-abrasive-grain manner and the conventional fixed-abrasive-grain manner.

Consequently, as shown in Table 2 and FIG. 3, the wafers had an average TTV of 12.43 (μm) and an average warp of 10.45 (μm); thus the obtained wafers had much better shape accuracy than those in comparative examples described later. These TTV and warp values were equal to shape quality obtained by slicing in the loose-abrasive-grain manner (see FIG. 6). This confirms that the present invention, which uses the fixed-abrasive-grain wire, can significantly shorten the slicing time and yield wafers with shape accuracy equal to those obtained with loose abrasive grains. In addition, TTV and warp were improved in examples 2 and 3, compared with example 1. It is considered to be caused by higher abrasive grain density, namely 1500 grains/mm$^2$, than example 1 while the above percentage was kept 2% or less in the distribution of the distances between centroids of the abrasive grains.

Comparative Example 1

A silicon single crystal ingot was sliced under the same condition as in example 1 except that the used fixed-abrasive-grain wire had an abrasive grain density of 900 grains/mm$^2$, and 1.6% of all distances between centroids of the abrasive grains were equal to or shorter than an average circle equivalent diameter of the whole abrasive grains. Then, average TTV and warp of all sliced-out wafers were calculated.

Figure 4:
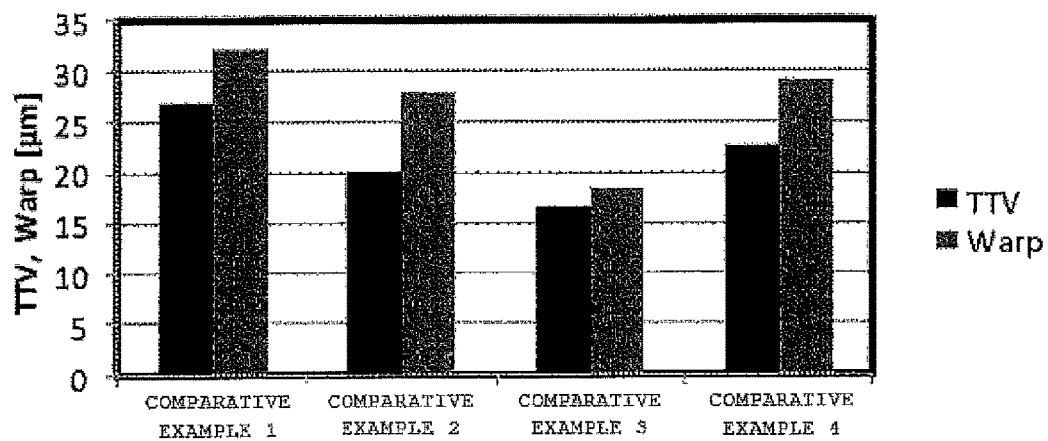
FIG. 4 is a graph showing results of TTV and warp of comparative examples 1 to 4.
Figure 5:
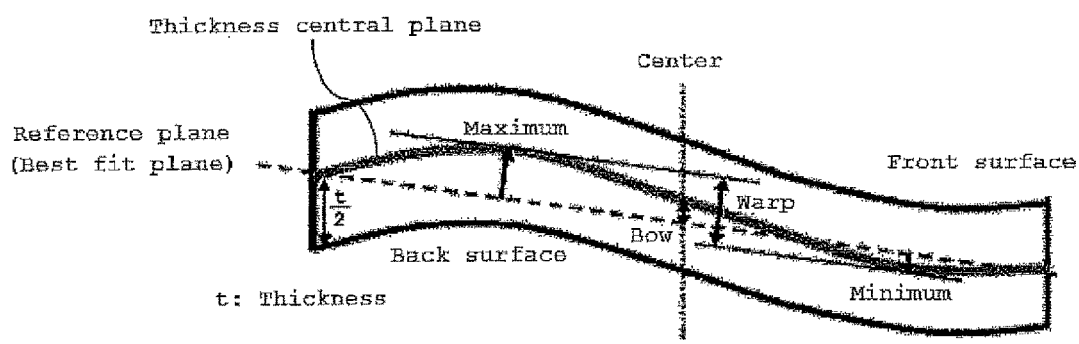
FIG. 5 is an explanatory diagram showing the definition of warp.

Consequently, as shown in FIGS. 3 and 4 and Table 2, the wafers had an average TTV of 26.81 (μm) and an average warp of 32.22 (μm). It was thus revealed that when the number of the abrasive grains is small, i.e., when the abrasive grain density is less than 1200 grains/mm$^2$, both TTV and warp of the wafers are degraded, and the wafers have significantly poor shape accuracy.

Comparative Example 2

A silicon single crystal ingot was sliced under the same condition as in example 1 except that the used fixed-abrasive-grain wire had an abrasive grain density of 1000 grains/mm$^2$, and 1.8% of all distances between centroids of the abrasive grains were equal to or shorter than an average circle equivalent diameter of the whole abrasive grains. Then, average TTV and warp of all sliced-out wafers were calculated.

Consequently, as shown in FIGS. 3 and 4 and Table 2, the wafers had an average TTV of 20 (μm) and an average warp of 28 (μm). It was thus revealed that when the abrasive grain density is less than 1200 grains/mm$^2$, both TTV and warp of the wafers are degraded, and the wafers have significantly poor shape accuracy.

Comparative Example 3

A silicon single crystal ingot was sliced under the same condition as in example 1 except that the used fixed-abrasive-grain wire had an abrasive grain density of 1200 grains/mm$^2$, and 3.8% of all distances between centroids of the abrasive grains were equal to or shorter than an average circle equivalent diameter of the whole abrasive grains. Then, average TTV and warp of all sliced-out wafers were calculated.

Consequently, as shown in FIG. 4 and Table 2, the wafers had an average TTV of 16.64 (μm) and an average warp of 18.25 (μm). It was thus revealed that, even if the abrasive grain density is 1200 grains/mm$^2$ or more, when more than 2% of distances between centroids of the abrasive grains are equal to or shorter than the average circle equivalent diameter, and the abrasive grains are agglomerated with the increase in abrasive grain density, both TTV and warp of the wafers are degraded, and the wafers have significantly poor shape accuracy.

Comparative Example 4

A silicon single crystal ingot was sliced under the same condition as in example 1 except that the used fixed-abrasive-grain wire had an abrasive grain density of 1500 grains/mm$^2$, and 4.3% of all distances between centroids of the abrasive grains were equal to or shorter than an average circle equivalent diameter of the whole abrasive grains. Then, average TTV and warp of all sliced-out wafers were calculated.

Consequently, as shown in FIG. 4 and Table 2, the wafers had an average TTV of 22.57 (μm) and an average warp of 29.04 (μm). It was thus revealed that, when agglomeration of the abrasive grains proceeds with the increase in abrasive grain density, both TTV and warp of the wafers are more degraded, and the wafers have significantly poor shape accuracy.

TABLE 1

| Wire | Abrasive grain density [grains/mm$^2$] | Average circle equivalent diameter [μm] | Intercentroid distance (distribution) | |
|---|---|---|---|---|
| | | | Average [μm] | Percentage of ≤average circle equivalent diameter |
| Comparative example 1 | 900 | 11.7 | 146 | 1.60% |
| Comparative example 2 | 1000 | 13.1 | 142.5 | 1.80% |
| Comparative example 3 | 1200 | 12 | 141.8 | 3.80% |
| Comparative example 4 | 1500 | 12.3 | 137.1 | 4.30% |
| Example 1 | 1200 | 14.9 | 140.4 | 0.90% |
| Example 2 | 1500 | 12.8 | 139.5 | 2.00% |
| Example 3 | 1500 | 15.8 | 142.8 | 1.50% |

TABLE 2

| Wire | TTV [μm] | Warp [μm] |
|---|---|---|
| Comparative example 1 | 26.81 | 32.22 |
| Comparative example 2 | 20 | 28 |
| Comparative example 3 | 16.64 | 18.25 |
| Comparative example 4 | 22.57 | 29.04 |
| Example 1 | 12.55 | 15.1 |
| Example 2 | 11.8 | 12.5 |
| Example 3 | 12.43 | 10.45 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A fixed-abrasive-grain wire comprising a core wire and abrasive grains fixed on a surface of the core wire, wherein an abrasive grain density is 1200 grains/mm$^2$ or more, where the abrasive grain density is the number of the abrasive grains per unit area on the surface of the core wire, and 2% or less of all distances between centroids of the abrasive grains are equal to or shorter than an average circle equivalent diameter of the whole abrasive grains.

2. The fixed-abrasive-grain wire according to claim 1, wherein the abrasive grains are diamond abrasive grains.

3. The fixed-abrasive-grain wire according to claim 1, wherein the abrasive grains fixed on the surface of the core wire have a particle size distribution in which a minimum grain diameter is 4 µm and a maximum grain diameter is 16 µm.

4. The fixed-abrasive-grain wire according to claim 2, wherein the abrasive grains fixed on the surface of the core wire have a particle size distribution in which a minimum grain diameter is 4 µm and a maximum grain diameter is 16 µm.

5. A wire saw comprising a wire row formed by spirally winding a fixed-abrasive-grain wire according to claim 1 around a plurality of wire guides, a workpiece-feeding unit for holding a workpiece and pressing the workpiece against the wire row, and a nozzle for supplying a coolant to a contact portion between the workpiece and the wire, wherein the wire saw is configured to slice the workpiece into wafers by pressing the workpiece against the wire row with the workpiece-feeding unit while supplying the coolant to the wire through the nozzle.

6. A wire saw comprising a wire row formed by spirally winding a fixed-abrasive-grain wire according to claim 2 around a plurality of wire guides, a workpiece-feeding unit for holding a workpiece and pressing the workpiece against the wire row, and a nozzle for supplying a coolant to a contact portion between the workpiece and the wire, wherein the wire saw is configured to slice the workpiece into wafers by pressing the workpiece against the wire row with the workpiece-feeding unit while supplying the coolant to the wire through the nozzle.

7. A wire saw comprising a wire row formed by spirally winding a fixed-abrasive-grain wire according to claim 3 around a plurality of wire guides, a workpiece-feeding unit for holding a workpiece and pressing the workpiece against the wire row, and a nozzle for supplying a coolant to a contact portion between the workpiece and the wire, wherein the wire saw is configured to slice the workpiece into wafers by pressing the workpiece against the wire row with the workpiece-feeding unit while supplying the coolant to the wire through the nozzle.

8. A wire saw comprising a wire row formed by spirally winding a fixed-abrasive-grain wire according to claim 4 around a plurality of wire guides, a workpiece-feeding unit for holding a workpiece and pressing the workpiece against the wire row, and a nozzle for supplying a coolant to a contact portion between the workpiece and the wire, wherein the wire saw is configured to slice the workpiece into wafers by pressing the workpiece against the wire row with the workpiece-feeding unit while supplying the coolant to the wire through the nozzle.

9. A method for slicing a workpiece, comprising: preparing a fixed-abrasive-grain wire having a core wire and abrasive grains fixed on a surface of the core wire; forming a wire row by spirally winding the prepared fixed-abrasive-grain wire around a plurality of wire guides; and pressing the workpiece against the wire row while imparting axial reciprocating motion to the fixed-abrasive-grain wire to slice the workpiece into wafers, wherein preparing the fixed-abrasive-grain wire includes the steps of
  taking an image of a surface of the fixed-abrasive-grain wire and extracting the abrasive grains on the image by an image binarization analysis,
  measuring the number of the extracted abrasive grains and determining an abrasive grain density that is the number of the abrasive grains per unit area,
  measuring circle equivalent diameters of the extracted abrasive grains and calculating an average circle equivalent diameter of the whole abrasive grains,
  measuring centroids of the extracted abrasive grains and determining all distances between the centroids of the abrasive grains, and
  selecting the fixed-abrasive-grain wire if the fixed-abrasive-grain wire satisfies that the determined abrasive grain density is 1200 grains/mm$^2$ or more, and 2% or less of the determined distances between the centroids of the abrasive grains are equal to or shorter than the calculated average circle equivalent diameter of the whole abrasive grains, whereby the workpiece is sliced with the selected fixed-abrasive-grain wire.

10. The method for slicing a workpiece according to claim 9, wherein the image of the surface of the fixed-abrasive-grain wire is taken with a scanning electron microscope or a confocal laser microscope.

11. The method for slicing a workpiece according to claim 9, wherein the abrasive grains are diamond abrasive grains.

12. The method for slicing a workpiece according to claim 10, wherein the abrasive grains are diamond abrasive grains.

13. The method for slicing a workpiece according to claim 9, wherein the abrasive grains fixed on the surface of the core wire in the prepared fixed-abrasive-grain wire have a particle size distribution in which a minimum grain diameter is 4 µm and a maximum grain diameter is 16 µm.

14. The method for slicing a workpiece according to claim 10, wherein the abrasive grains fixed on the surface of the core wire in the prepared fixed-abrasive-grain wire have a particle size distribution in which a minimum grain diameter is 4 µm and a maximum grain diameter is 16 µm.

15. The method for slicing a workpiece according to claim 11, wherein the abrasive grains fixed on the surface of the core wire in the prepared fixed-abrasive-grain wire have a particle size distribution in which a minimum grain diameter is 4 µm and a maximum grain diameter is 16 µm.

16. The method for slicing a workpiece according to claim 12, wherein the abrasive grains fixed on the surface of the core wire in the prepared fixed-abrasive-grain wire have a particle size distribution in which a minimum grain diameter is 4 µm and a maximum grain diameter is 16 µm.

* * * * *